United States Patent
Kim et al.

(10) Patent No.: US 8,536,570 B2
(45) Date of Patent: Sep. 17, 2013

(54) COMPOSITION FOR OXIDE THIN FILM, PREPARATION METHOD OF THE COMPOSITION, METHODS FOR FORMING THE OXIDE THIN FILM USING THE COMPOSITION, AND ELECTRONIC DEVICE USING THE COMPOSITION

(75) Inventors: Hyun Jae Kim, Seoul (KR); Woong Hee Jeong, Seoul (KR); Jung Hyeon Bae, Gyeonggi-do (KR); Kyung Min Kim, Busan (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 20 days.

(21) Appl. No.: 13/341,060

(22) Filed: Dec. 30, 2011

(65) Prior Publication Data

US 2012/0168747 A1 Jul. 5, 2012

(30) Foreign Application Priority Data

Dec. 31, 2010 (KR) .................. 10-2010-0139870

(51) Int. Cl.
*H01L 29/10* (2006.01)
*H01B 1/02* (2006.01)

(52) U.S. Cl.
USPC .............. 257/43; 257/E29.068; 257/E21.461; 252/519.51

(58) Field of Classification Search
CPC ..... H01L 29/7869; H01L 21/16; H01L 21/00; C23C 14/086
USPC ...... 257/43, E29.068, E21.461; 252/519.21, 252/519.5, 519.51
See application file for complete search history.

(56) References Cited

U.S. PATENT DOCUMENTS

| | | | |
|---|---|---|---|
| 7,947,537 B2 | 5/2011 | Honda et al. | |
| 8,017,458 B2 | 9/2011 | Marks et al. | |
| 2006/0251818 A1* | 11/2006 | Ukishima et al. | 427/376.1 |
| 2010/0251936 A1* | 10/2010 | Kim et al. | 106/286.6 |
| 2010/0258793 A1* | 10/2010 | Seon et al. | 257/43 |

FOREIGN PATENT DOCUMENTS

| | | |
|---|---|---|
| KR | 10-2010-0095328 A | 8/2010 |
| KR | 10-2010-0112522 A | 10/2010 |
| WO | WO2009/054574 | * 4/2009 |

* cited by examiner

*Primary Examiner* — Nikolay Yushin
(74) *Attorney, Agent, or Firm* — Carter, DeLuca, Farrell & Schmidt, LLP (57) ABSTRACT

Provided are a composition for an oxide semiconductor, a preparation method of the composition, a method for forming an oxide semiconductor thin film using the composition, and a method for forming an electronic device using the composition. The composition for an oxide semiconductor includes a compound for an oxide thin film and a stabilizer for adjusting conductivity of the oxide thin film. The stabilizer is included with the mole number of two to twelve times larger than the total mole number of the compound.

14 Claims, 5 Drawing Sheets

COMPOSITION FOR OXIDE THIN FILM, PREPARATION METHOD OF THE COMPOSITION, METHODS FOR FORMING THE OXIDE THIN FILM USING THE COMPOSITION, AND ELECTRONIC DEVICE USING THE COMPOSITION

CROSS-REFERENCE TO RELATED APPLICATIONS

This U.S. non-provisional patent application claims priority under 35 U.S.C. §119 of Korean Patent Applications Nos. 10-2010-0139870, filed on Dec. 31, 2010, the entire contents of which are hereby incorporated by reference.

BACKGROUND

The exemplary embodiments of the inventive concepts disclosed herein relate to a composition for an oxide thin film, a preparation method of the composition, a method of forming the oxide thin film, and an electronic device including the oxide thin film.

Recently, researches have been widely conducted on oxide semiconductors which will replace typical silicon-based semiconductor devices. In terms of materials, the research has been reported on single, binary, and tertiary compounds based on indium oxide ($In_2O_3$), zinc oxide (ZnO), and gallium oxide ($Ga_2O_3$) as the oxide semiconductors. Meanwhile, in process aspects of the oxide semiconductors, researches are conducted on a solution process replacing typical vacuum deposition.

Although oxide semiconductors have an amorphous phase like hydrogenated amorphous silica, the oxide semiconductors are suitable to a high image quality liquid crystal display (LCD) and an active matrix organic light-emitting diode (AMOLED) because of significantly high mobility (5~10 $cm^2/Vs$ or higher). Also, a technology of fabricating the oxide semiconductors using a solution process may be low cost in comparison to a high-cost vacuum deposition method. Disadvantageously, formation of an oxide semiconductor thin film with high mobility and high reliability using a conventional solution process requires high-temperature annealing. An annealing temperature above 450° C. involves difficulty in being applied to not only plastic substrates but also eighth or later generation large-sized glass substrates.

SUMMARY

Exemplary embodiments of the inventive concepts provide a composition for an oxide semiconductor thin film, a method of forming an oxide thin film, an electronic device, and an oxide semiconductor thin film.

According to one embodiment of the inventive concept, the composition for an oxide semiconductor thin film may include a first compound supplying zinc; a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and a stabilizer for adjusting conductivity. The stabilizer may be included with the mole number of two to twelve times greater than the total mole number of the first compound and the second compound.

According to one embodiment of the inventive concept, the method of forming an oxide thin film may include coating a composition for an oxide thin film on a substrate; and annealing the substrate with the coated composition at a temperature ranging from 100 to 450° C. The composition for an oxide thin film may include a first compound supplying zinc; a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and a stabilizer for adjusting conductivity. The stabilizer may be included with the mole number of two to twelve times greater than the total mole number of the first compound and the second compound.

According to one embodiment of the inventive concept, the electronic device may include an oxide semiconductor thin film; a gate electrode spaced apart from the oxide semiconductor thin film and overlapping the oxide semiconductor thin film; a source electrode electrically connected to the oxide semiconductor thin film and disposed at one end of the gate electrode; and a drain electrode electrically connected to the oxide semiconductor thin film and disposed at the other end of the gate electrode to face the source electrode. The oxide semiconductor thin film may be formed by a method including coating a composition for an oxide thin film on a substrate and annealing the substrate at a temperature ranging from 100 to 450° C.

According to one embodiment of the inventive concept, the semiconductor device may include an oxide semiconductor thin film disposed on a flexible substrate or a glass substrate. The oxide semiconductor thin film is formed by a method including coating a composition for an oxide thin film on a substrate and annealing the substrate at a temperature ranging from 100 to 450° C.

BRIEF DESCRIPTION OF THE DRAWINGS

The exemplary embodiments of the inventive concept will become more apparent in view of the attached drawings and accompanying detailed description. The embodiments depicted therein are provided by way of example, not by way of limitation. The drawings are not necessarily to scale, emphasis instead being placed upon illustrating aspects of the present invention.

DETAILED DESCRIPTION OF THE EMBODIMENTS

Advantages and features of the exemplary embodiments of the inventive concept, and implementation methods thereof will be clarified through following embodiments described with reference to the accompanying drawings. The exemplary embodiments may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims.

Though not defined, all terms (including technical or scientific terms) used herein have the same meanings as those generally accepted by universal technologies in the related art to which the present invention pertains. The terms defined by general dictionaries may be construed as having the same meanings as those in the related art and/or the text of the present application, and will not be construed as being conceptualized or excessively formal although the terms are not clearly defined expressions herein.

In the following description, the technical terms are used only for explaining a specific exemplary embodiment while not limiting the present invention. The terms of a singular form may include plural forms unless referred to the contrary. The meaning of 'include', 'comprise', 'including', or 'comprising', specifies a property, a region, a fixed number, a step, a process, an element and/or a component but does not exclude other properties, regions, fixed numbers, steps, processes, elements and/or components.

Outline of the Invention

Disadvantageously, formation of an oxide semiconductor thin film with high mobility and high reliability using a conventional solution process requires annealing of high temperature above 450° C. The annealing temperature above 450° C. causes a plastic substrate to be transformed and involves difficulty in being applied to eighth or later generation large-sized glass substrates.

Accordingly, embodiments of the inventive concept provide a method for manufacturing an electric device with an applied oxide material at a annealing temperature (e.g., 450° C. or less) applicable to a large-sized glass or plastic substrate using change in composition of a solution, change in concentration of a stabilizer or the like.

A composition for an oxide thin film according to one embodiment of the inventive concept includes a first compound providing zinc. Also the composition for an oxide thin film includes a second compound providing at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium.

According to one embodiment of the inventive concept, a stabilizer for adjusting conductivity of a thin film is also used in low-temperature annealing to exhibit high mobility and high reliability.

According to one embodiment of the inventive concept, the stabilizer includes a compound containing an amine group. The compound containing an amine group may include, for example, monoethanolamine, diethanolamine, triethanolamine, mono-isopropyl amine, N,N-methyl ethanol amine, aminoethyl ethanolamine, diethylene glycol amine, ethylenediamine, tetra-methyl-ethyl-diamine, N-t-butylethanolamine, N-t-butyl diethanolamine, methyl amine, and ethyl amine.

Also the stabilizer may include 2-(aminoethoxy) ethanol, tetramethylammonium hydroxide, and acetylacetone.

The composition for an oxide thin film according to one embodiment of the inventive concept includes a stabilizer with the mole number that is two to twelve times, preferably, two to eight times larger than the total mole number of first and second compounds for oxide thin film composition atoms.

When the mole number of the stabilizer is twice less than the total mole number of the first and second compounds, on-current of a transistor based on the oxide thin film formed is small. When the mole number of the stabilizer is doubled, the on-current increases rapidly. From the point when the mole number of the stabilizer exceeds twelve times, the on-current decreases.

Composition for Oxide Thin Film

A solution composition according to one embodiment of the inventive concept will now be described below. The solution composition is a precursor solution used to form an oxide semiconductor thin film.

A precursor solution according to one embodiment of the inventive concept includes a first compound providing zinc, a second compound providing at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium, and a stabilizer for adjusting conductivity. The stabilizer is included with the mole number that is two to twelve lager than the total mole number of the first and second compounds.

In the precursor solution for the oxide thin film according to one embodiment of the inventive concept, an atom number ratio of zinc to indium and tin may be 1:9 to 9:1.

In the precursor solution for the oxide thin film according to one embodiment of the inventive concept, an atom number ratio of zinc to gallium, hafnium, magnesium, aluminum, yttrium, tantalum, titanium, zirconium, barium, lanthanum, manganese, tungsten, molybdenum, cerium, chromium, scandium, silicon, neodymium or strontium may be 1:0.01 to 1:1.

In the precursor solution for the oxide thin film according to one embodiment of the inventive concept, concentrations of the first and second compounds may be 0.1 M to 10M, respectively.

A first compound providing zinc may be selected from zinc salts and their hydrates, but is not limited thereto. Detailed examples of the first compound may be zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, and their hydrates. The first compound may include at least one selected from the group consisting of the above-mentioned examples.

An indium compound providing indium may be selected from indium salts and their hydrates, but is not limited thereto. Detailed examples of the indium compound may be indium chloride, indium chloride tetrahydrate, indium fluoride, indium fluoride trihydrate, indium hydroxide, indium nitrate hydrate, indium acetate hydrate, indium acetylacetonate, and indium acetate.

A tin compound providing tin may be selected from tin salts and their hydrates, but is not limited thereto. Detailed examples of the tin compound may be tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin (IV) iodide, tin(IV) sulfide, tin(IV) tert-butoxide, and their hydrates. The tin compound may include at least one selected from the group consisting of the above-mentioned examples.

A gallium compound providing gallium may be gallium salts and their hydrates, but is not limited thereto. Detailed examples of the gallium compound may be gallium nitride, gallium phosphide, gallium(II) chloride, gallium(III) acetylacetonate, gallium(III) bromide, gallium(III) chloride, gallium(III) fluoride, gallium(III) iodide, gallium(III) nitrate hydrate, gallium(III) sulfate, gallium(III) sulfate hydrate, and their hydrates. The gallium compound may include at least one selected from the group consisting of the above-mentioned examples.

A zirconium compound providing zirconium may be selected from zirconium slats and their hydrates, but is not limited thereto. Detailed examples of the zirconium compound may be zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium (IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, and their hydrates. The zirconium compound may include at least one selected from the group consisting of the above-mentioned examples.

An aluminum compound providing aluminum may be selected from aluminum salts and their hydrates. Detailed examples of the aluminum compound may be aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, aluminum tert-butoxide, and their hydrates. The aluminum compound may include at least one selected from the group consisting of the above-mentioned examples.

A neodymium compound providing neodymium may be selected from neodymium salts and their hydrates, but is not limited thereto. Detailed examples of the neodymium compound may be neodymium(II) iodide, neodymium(III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium(III) fluoride, neodymium(III) hydroxide hydrate, neodymium (III) iodide, neodymium(III) isopropoxide, neodymium(III) nitrate hexahydrate, neodymium(III) nitrate hydrate, neodymium(III) oxalate hydrate, neodymium(III) phosphate hydrate, neodymium(III) sulfate, neodymium(III) sulfate hydrate, and their hydrates. The neodymium compound may include at least one selected from the group consisting of the above-mentioned examples.

A scandium compound providing scandium may be selected from scandium salts and their hydrates, but is not limited thereto. Detailed examples of the scandium compound may be scandium acetate hydrate, scandium acetylacetonate hydrate, scandium chloride, scandium chloride hexahydrate, scandium chloride hydrate, scandium fluoride, scandium nitrate hydrate, and their hydrates. The scandium compound may include at least one selected from the group consisting of the above-mentioned examples.

A tantalum compound providing tantalum may be selected from tantalum salts and their hydrates, but is not limited thereto. Detailed examples of the tantalum compound may be tantalum bromide, tantalum chloride, tantalum fluoride, and their hydrates. The tantalum compound may include at least one selected from the group consisting of the above-mentioned examples.

A titanium compound providing tantalum may be selected from titanium salts and their hydrates, but is not limited thereto. Detailed examples of the tantalum compound may be titanium bromide, titanium chloride, titanium fluoride, and their hydrates. The titanium compound may include at least one selected from the group consisting of the above-mentioned examples.

A barium compound providing barium may be selected from barium salts and their hydrates, but is not limited thereto. Detailed examples of the barium compound may be barium acetate, barium acetylacetonate, barium bromide, barium chloride, zirconium fluoride, barium hexafluoroacetylacetonate, barium hydroxide, barium nitrate, and their hydrates. The barium compound may include at least one selected from the group consisting of the above-mentioned examples.

A lanthanum compound providing lanthanum may be selected from lanthanum salts and their hydrates, but is not limited thereto. Detailed examples of the lanthanum compound may be lanthanum acetate, lanthanum acetylacetonate, lanthanum bromide, lanthanum chloride, lanthanum hydroxide, lanthanum fluoride, lanthanum nitrate, and their hydrates. The lanthanum compound may include at least one selected from the group consisting of the above-mentioned examples.

A manganese compound providing manganese may be selected from manganese salts and their hydrates, but is not limited thereto. Detailed examples of the manganese compound may be manganese acetate, manganese acetylacetonate, manganese bromide, manganese chloride, manganese fluoride, manganese nitrate, and their hydrates. The manganese compound may include at least one selected from the group consisting of the above-mentioned examples.

A chrome compound providing chrome may be selected from chrome salts and their hydrates, but is not limited thereto. Detailed examples of the chrome compound may be chromium acetate, chromium acetylacetonate, chromium bromide, chromium chloride, chromium fluoride, chromium nitrate, and their hydrates. The chrome compound may include at least one selected from the group consisting of the above-mentioned examples.

A strontium compound providing strontium may be selected from strontium salts and their hydrates, but is not limited thereto. Detailed examples of the strontium compound may be strontium acetate, strontium acetylacetonate, strontium bromide, strontium chloride, strontium fluoride, strontium hydroxide, strontium nitrate, and their hydrates. The strontium compound may include at least one selected from the group consisting of the above-mentioned examples.

An yttrium compound providing yttrium may be selected from yttrium salts and their hydrates, but is not limited thereto. Detailed examples of the yttrium compound may be yttrium acetate, yttrium acetylacetonate, yttrium chloride, yttrium fluoride, yttrium nitrate, and their hydrates. The yttrium compound may include at least one selected from the group consisting of the above-mentioned examples.

A cerium compound providing cerium may be selected from cerium salts and their hydrates, but is not limited thereto. Detailed examples of the cerium compound may be cerium (III) acetate hydrate, cerium(III) acetylacetonate hydrate, cerium(III) bromide, cerium(III) carbonate hydrate, cerium (III) chloride, cerium(III) chloride heptahydrate, cerium(III)

fluoride, cerium(III) iodide, cerium(III) nitrate hexahydrate, cerium(III) oxalate hydrate, cerium(III) sulfate, cerium(III) sulfate hydrate, cerium(III) sulfate octahydrate, cerium(IV) fluoride, cerium(IV) hydroxide, cerium(IV) sulfate, cerium (IV) sulfate hydrate, cerium(IV) sulfate tetrahydrate, and their hydrates. The cerium compound may include at least one selected from the group consisting of the above-mentioned examples.

A hafnium compound providing manganese may be selected from hafnium salts and their hydrates, but is not limited thereto. The hafnium compound includes hafnium chloride and hafnium fluoride.

A silicon compound providing silicon may include at least one selected from the group consisting of silicon tetraacetate, silicon tetrabromide, silicon tetrachloride, and silicon tetrafluoride.

The oxide thin film composition according to one embodiment of the inventive concept may include a solvent capable of dissolving the above-mentioned compounds. The solvent may include at least one selected from the group consisting of deionized water, methanol, ethanol, propanol, isopropanol, 2-methoxyethanol, 2-ethoxyethanol, 2-proxyethanol, 2-butoxyethanol, methyl cellosolve, ethyl cellosolve, diethylene glycol methyl ether, ethylene glycol ethyl ether, dipropylene glycol methyl ether, toluene, xylene, hexane, heptane, octane, ethyl acetate, butyl acetate, diethylene glycol dimethyl ether, diethylene glycol dimethyl ethyl ether, methyl methoxypropionic acid, ethyl ethoxypropionic acid, ethyl lactic acid, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone, γ-butyrolactone, diethyl ether, ethylene glycol dimethyl ether, diglaim, tetrahydrofuran, acetylacetone, and acetonitrile.

Embodiment 1

InGaZnO (IGZO) Precursor Solution

In this embodiment, 2-methoxyethanol, indium nitrate hydrate, gallium nitrate hydrate, zinc acetate dihydrate were prepared as start solutions. Precursor compounds were mixed and dissolved in a solvent of 2-methoxyethanol according to their respective molar ratios such that their molar ratio (atom number ratio) was 3:2:1 and the total molar concentration was 0.5M. And then, mono-ethanolamine and acetic acid ($CH_3COOH$) acting as stabilizers for stabilization and conductivity adjustment of the oxide solution were added and stirred at a rate of about 340 rpm for about 40 minutes by using a magnetic bar at a hot plate temperature of about 70° C. Thereafter, aging for stabilization was conducted for about 24 hours. The sufficiently stirred solution had a yellow transparent form, and contaminants in the solution were filtered using a 0.25 micrometer filter.

A precursor solution was prepared while changing the concentration of the mono-ethanolamine acting as a stabilizer. That is, the composition was prepared while changing a molar ratio of the total molar ratio of indium nitrate hydrate, gallium nitrate hydrate, and zinc acetate dehydrate to the mono-ethanolamine to be 1:1, 1:2, 1:3, 1:4, 1:6, 1:8, 1:10, and 1:12.

Embodiment 2

InZnO (IZO) Precursor Solution

In this embodiment, 2-methoxyethanol, indium nitrate hydrate, and zinc acetate dihydrate were prepared as start solutions. Precursor compounds were mixed and dissolved in and a solvent of 2-methoxyethanol according to their respective molar ratios such that their molar ratio (atom number ratio) was 3:2:1 and the total molar concentration was 0.5M. And then, mono-ethanolamine and acetic acid ($CH_3COOH$) acting as stabilizers for stabilization and conductivity adjustment of the oxide solution were added and stirred at a rate of about 340 rpm for about 40 minutes by using a magnetic bar at a hot plate temperature of about 70° C. Thereafter, aging for stabilization was conducted for about 24 hours. The sufficiently stirred solution had a yellow transparent form, and contaminants in the solution were filtered using a 0.25 micrometer filter.

A precursor solution was prepared while changing the concentration of the mono-ethanolamine acting as a stabilizer. That is, the composition was prepared while changing a molar ratio of the total molar ratio of indium nitrate hydrate and zinc acetate dehydrate to the mono-ethanolamine to be 1:1, 1:2, 1:3, 1:4, 1:6, 1:8, 1:10, and 1:12.

Embodiment 3

HfInZnO Precursor Solution

In this embodiment, 2-methoxyethanol, hafnium chloride, indium nitrate hydrate, gallium nitrate hydrate, zinc acetate dihydrate were prepared as start solutions. Precursor compounds were mixed and dissolved in a solvent of 2-methoxyethanol according to their respective molar ratios such that their molar ratio (atom number ratio) was 0.2:5:2 and the total molar concentration was 0.3M. And then, mono-ethanolamine and acetic acid ($CH_3COOH$) acting as stabilizers for stabilization and conductivity adjustment of the oxide solution were added and stirred at a rate of about 340 rpm for about 40 minutes by using a magnetic bar at a hot plate temperature of about 70° C. Thereafter, aging for stabilization was conducted for about 24 hours. The sufficiently stirred solution had a yellow transparent form, and contaminants in the solution were filtered using a 0.25 micrometer filter.

A precursor solution was prepared while changing the concentration of the mono-ethanolamine acting as a stabilizer. That is, the composition was prepared while changing a molar ratio of the total molar ratio of hafnium chloride, indium nitrate hydrate, and zinc acetate dihydrate to the mono-ethanolamine to be 1:1, 1:2, 1:3, 1:4, 1:6, 1:8, 1:10, and 1:12.

Fabrication of Thin Film Transistor

A thin film transistor is fabricated using the above-mentioned precursor solution.

Molybdenum tungsten (MoW) is deposited on a glass substrate to a thickness of about 2000 angstroms and subjected to a photolithography process to form a gate electrode. Silicon nitride is deposited to a thickness of about 2000 angstroms by means of chemical vapor deposition (CVD) to form a gate insulating layer. After the precursor solution prepared according to the above embodiments is coated on the gate insulating layer, annealing is performed thereon. In this case, the coating of the precursor solution may be performed by means of spin coating, dip coating, inkjet printing, screen printing, spray printing, roll-to-roll coating or the like. The annealing may be performed using a furnace, a hot plate, a rapid thermal processor or the like at a temperature of about 300° C. for 5 minutes. Thereafter, tantalum is stacked to a thickness of 1000 angstroms and subjected to a photolithography process to form a source electrode and a drain electrode.

Evaluation

Thin film characteristics depending on the concentration of a stabilizer were evaluated with a thin film transistor fabricated using the precursor solution according to the above-described embodiments while changing annealing temperature after the coating process.

As mentioned above, after the coating process, the annealing temperature varied to 250, 300, 350, and 450° C. while the concentration of the stabilizer were changed to be one, two, three, four, six, eight, ten, and twelve times to the total mole number of the oxide precursor compound. Hereinafter, a case where a stabilizer (mono-ethanolamine) is added with the same mole number as an oxide precursor will be represented by 1*MEA. Similarly, cases where the stabilizer is added with the mole number of two, three, four, . . . times greater than the oxide precursor will be represented by 2*MEA, 3*MEA, 4*MEA, . . . , respectively.

Figure 1:
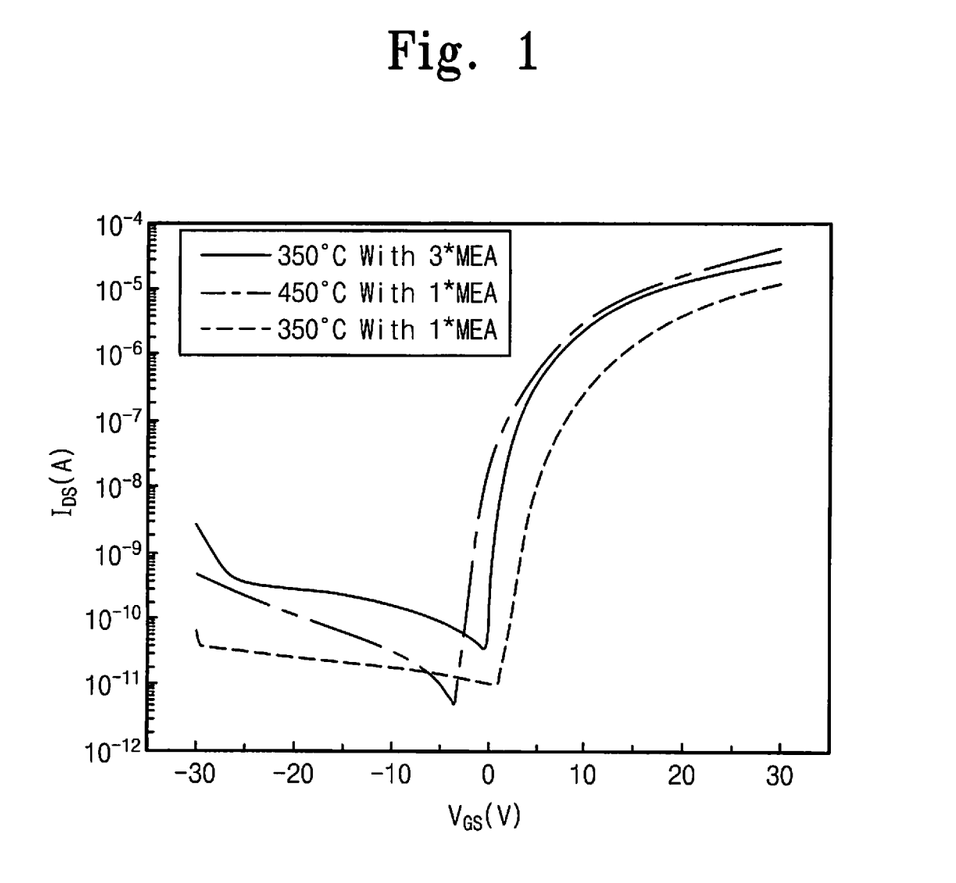
FIG. 1 illustrates I-V characteristics of a thin film transistor using an IGZO precursor solution according to one embodiment of the inventive concept.

FIG. 1 illustrates I-V characteristics of a thin film transistor using an IGZO precursor solution according to one embodiment of the inventive concept. In this embodiment, annealing of 350° C. for the stabilizer concentration of 3*MEA was compared with comparison groups that were annealing of 350° C. and annealing of 450° C. for the stabilizer concentration of 1*MEA, respectively.

From FIG. 1, characteristics of an IGZO TFT electronic device manufactured using an oxide precursor solution containing a stabilizer of 3*MEA concentration according to one embodiment of the inventive concepts are superior to those of an IGZO TFT electronic device manufactured by means of annealing of 350° C. using an oxide precursor solution containing a stabilizer of 1*MEA (when a gate voltage is 10 volt, the TFT electronic device manufactured using the IGZO solution of 3*MEA is higher in drain-source current of about 10 times). This is almost similar to the characteristic of the TFT electronic device manufactured by means of annealing of 450° C. using the IGZO oxide solution containing the conventional stabilizer of 1*MEA. Moreover, it may be seen that in spite of the same annealing of 350° C., a subthreshold slope (S.S) value of a TFT electronic device decreases with the amount of a stabilizer. For this reason, trap sites formed in a thin film and at the boundary between the thin film and a gate insulating layer seem to decrease in number. That is, the density of the thin film increases as the amount of the stabilize MEA increases, which means that the quality of the thin film is improved.

Figure 2:
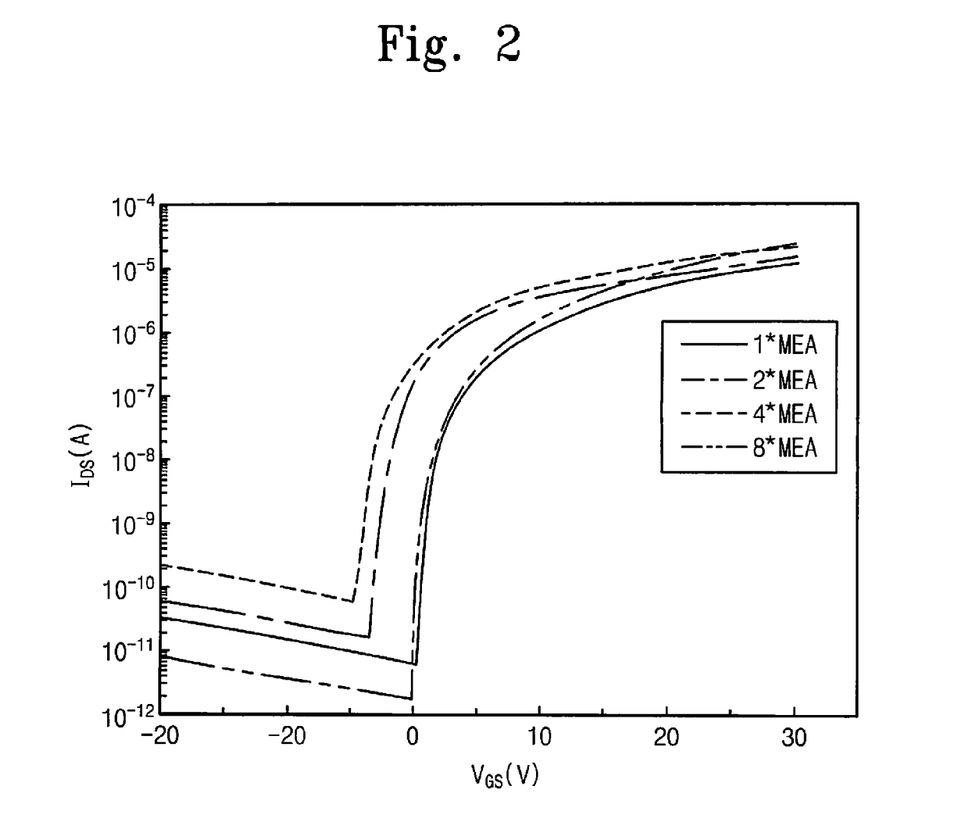
FIG. 2 illustrates I-V characteristics of a thin film transistor using an IZO precursor solution according to another embodiment of the inventive concept.

FIG. 2 illustrates I-V characteristics of a thin film transistor using an IZO precursor solution according to another embodiment of the inventive concepts. After coating an oxide precursor solution, annealing was performed at a temperature of 300° C. and the concentration of a stabilizer varied to 1*MEA, 2*MEA, 3*MEA, 4*MEA, and 8*MEA.

From FIG. 2, it may be seen that in transfer characteristics of the TFT electronic device adopting an annealing process of 300° C., characteristics of the TFT electronic device are improved as the concentration of a stabilizer MEA increases. Even in a case using an annealing process of 250° C., the characteristics of the TFT electronic device were not significantly different from the conventional tendency.

Figure 3:
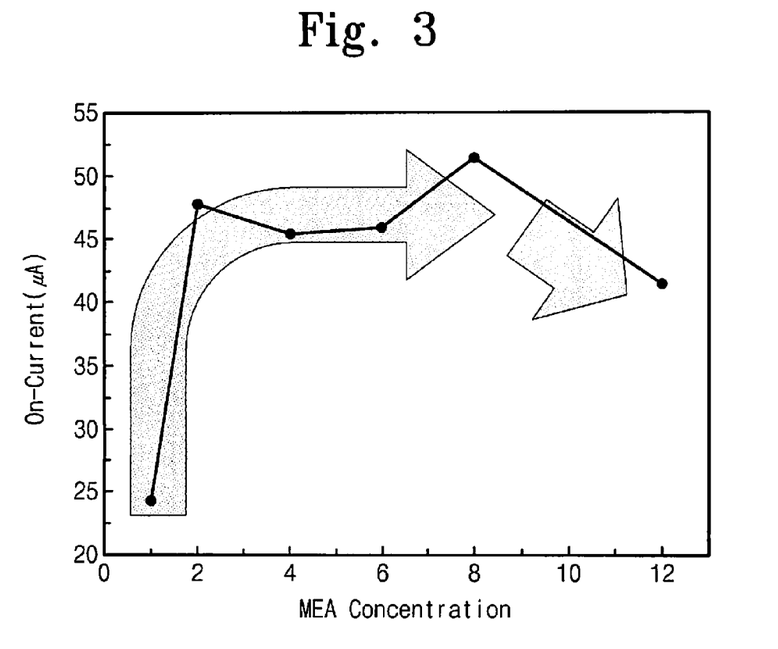
FIG. 3 illustrates on-current depending on a stabilizer concentration under the annealing of 300° C. for a thin film transistor using the IZO precursor solution according to another embodiment of the inventive concept.

FIG. 3 illustrates on-current depending on a stabilizer concentration under the annealing of 300° C. for a thin film transistor using the IZO precursor solution according to another embodiment of the inventive concepts.

From FIG. 3, it may be seen that on-current of the thin film transistor rapidly increases from the point of time when the stabilizer concentration is at least two times (2*MEA) more than the total mole number of an oxide precursor compound. In addition, it may be seen that the on-current is maintained at a high value even in the foregoing concentration or more and gradually decreases from the point of time when the stabilizer concentration exceeds 12 times. For this reason, it will be understood that in terms of the on-current, the stabilizer is preferably added with the mole number of two to twelve times greater than the total mole number of the oxide precursor solution.

Figure 4:
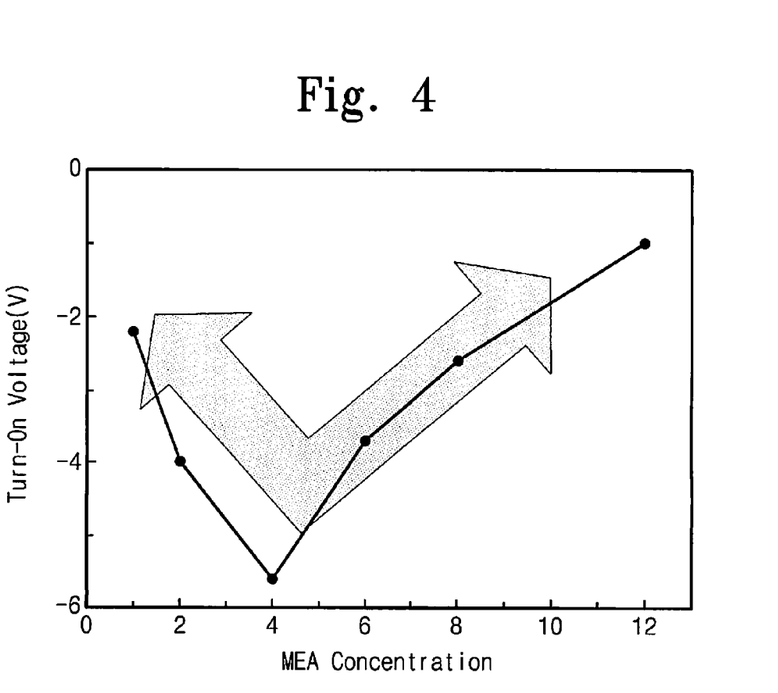
FIG. 4 illustrates turn-on voltage depending on a stabilizer concentration under the annealing of 300° C. for a thin film transistor using the IZO precursor solution according to another embodiment of the inventive concept.

FIG. 4 illustrates turn-on voltage depending on a stabilizer concentration under the annealing of 300° C. for a thin film transistor using the IZO precursor solution according to another embodiment of the inventive concepts.

From FIG. 4, it may be seen that a turn-on voltage migrates in a negative direction until the stabilizer concentration increases to four times and migrates in a positive direction from the point of time when the stabilizer concentration exceeds four times. For this reason, it will be understood that characteristics of the thin film are certainly improved until the stabilizer concentration increases to four times but are maintained at a good level until the stabilizer concentration increases to eight times from four times. As a result, it will be understood that in terms of the turn-on voltage, the stabilizer is preferably added with the mole number of two to eight times greater than the total mole number of the oxide precursor solution.

Hereinafter, an implementation example of applying an IZO to a thin film transistor will now be described with reference to FIG. 5.

Figure 5:
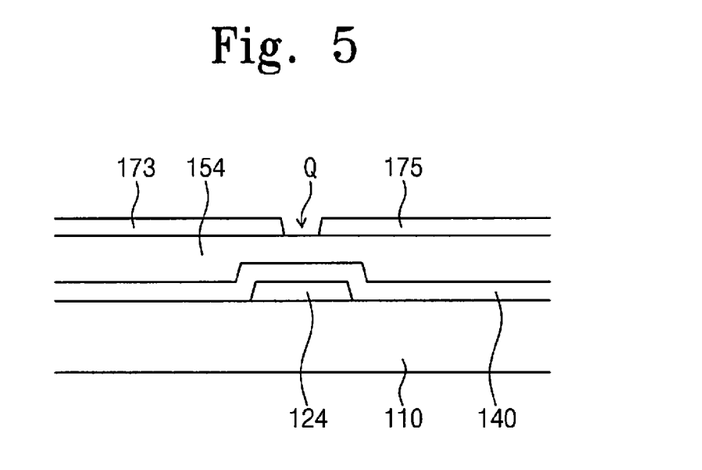
FIG. 5 is a cross-sectional view of a thin film transistor according to one implementation example of the inventive concept.

FIG. 5 is a cross-sectional view of a thin film transistor according to one implementation example of the present invention. Referring to FIG. 5, the thin film transistor includes a substrate 110 on which a gate electrode 124 is disposed. A gate insulating layer 140 is disposed on the gate electrode 124 to over the entire surface of the substrate 110.

An oxide semiconductor 154 is disposed on the gate insulating layer 140 to overlap the gate electrode 124. The oxide semiconductor is made of indium zinc oxide (IZO) containing indium (In) and zinc (Zn).

A source electrode 173 and a drain electrode 175 are disposed on the oxide semiconductor 154 to face each other. The source electrode 173 and the drain electrode 175 are electrically connected to the oxide semiconductor 154 during turn-on. At this point, a channel Q of the thin film transistor is formed at the oxide semiconductor 154 between the source electrode 173 and the drain electrode 175.

Hereinafter, a method of fabricating the thin film transistor in FIG. 5 will be described with reference to FIGS. 6 to 8.

Figure 6:
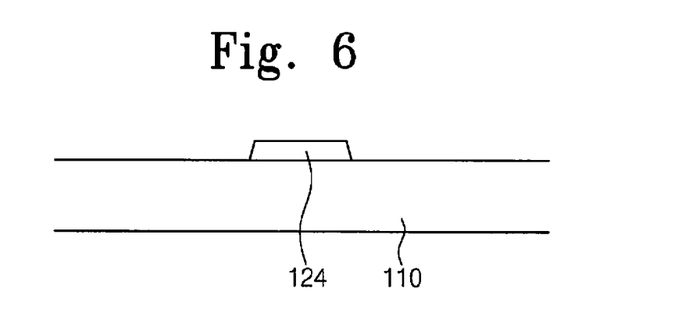
FIGS. 6 to 8 are cross-sectional views sequentially illustrating a method of fabricating the thin film transistor in FIG. 5.
Figure 7:
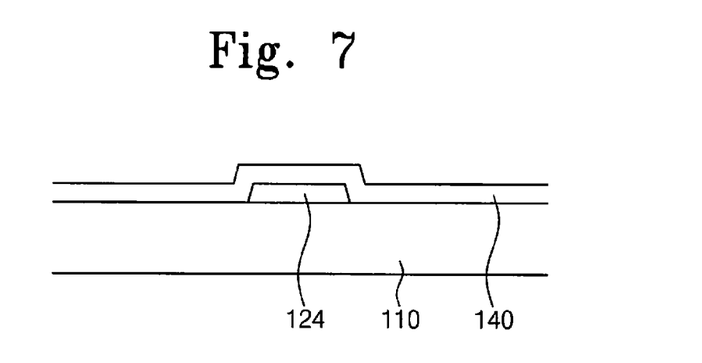
Figure 8:
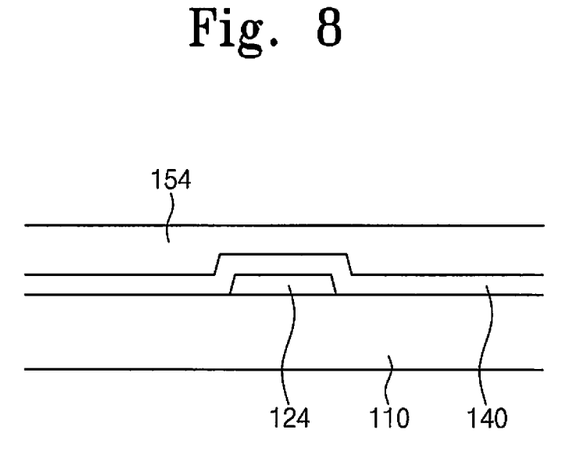

FIGS. 6 to 8 are cross-sectional views sequentially illustrating a method of fabricating the thin film transistor in FIG. 5.

Prior to fabrication of a thin film transistor, prepared is a precursor solution of indium zinc oxide (IZO) where the above-mentioned indium compound and zinc compound are mixed in a solvent. The potential of hydrogen (pH) of the precursor solution ranges from about 1 to about 10 and, more specifically, ranges from about 3.8 to about 4.2. After mixing respective components in the solvent, the precursor solution may be stirred, for example, at room temperature (about 25 degrees centigrade) for about one hour to about 100 hours. In this case, a stirrer or ultrasonic wave may be used. As such, the stirring step may be conducted to improve solubility and thin-film coatability. Thereafter, an aging step may be further conducted for about one hour to about 240 hours. The above-prepared precursor solution may be in the form of sol.

Referring to FIG. 6, a conductive layer is stacked on a substrate 110 formed of glass, silicon or plastic and then etched to form a gate electrode 124.

Referring to FIG. 7, silicon oxide ($SiO_2$), silicon nitride (SiNx) or organ insulating material is stacked on the gate electrode 124 to form a gate insulating layer 140.

Referring to FIG. 8, an oxide semiconductor 154 is formed on the gate insulating layer 140. The oxide semiconductor 154 may be formed by means of spin coating, slit coating, inkjet printing, spray printing, dipping, roll-to-roll coating or nano imprint.

Thereafter, the precursor solution is annealed to grow into an indium zinc oxide (IZO) thin film. The annealing may be performed at a high temperature after the precursor solution is prebaked at a relatively low temperature to turn the sol-state solution into a gel state.

Next, referring to FIG. 5, a conductive layer is stacked on the oxide semiconductor 154 and then subjected to a photo-lithography process to form a source electrode 173 and a drain electrode 175.

Although only a thin film transistor with a bottom gate structure has been exemplarily described in the above embodiment, the present invention is not limited thereto and may be applied to any thin film transistor such as a transistor with a top gate structure. In addition, although it has been exemplarily described in the above embodiment that oxide semiconductor is applied to a thin film transistor, the present invention is not limited thereto and may be equivalently applied to any electronic device. For example, the oxide semiconductor may be used as a material of a resistor, a capacitor, an inductor, a diode or the like and applied to a display device (e.g., LCD, AMOLED, etc.) including the above element or a solar cell including the above element.

As described so far, an oxide semiconductor can be formed by means of a solution process to simplify a manufacturing process and reduce manufacturing cost. In addition, an oxide semiconductor thin film can be formed by means of a low-temperature process to manufacture an electric device applicable to large-sized glass substrates and flexible substrates.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A composition for an oxide thin film, comprising:
a first compound supplying zinc;
a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and
a stabilizer for adjusting conductivity,
wherein the stabilizer is included with the mole number of two to twelve times greater than the total mole number of the first compound and the second compound.

2. The composition as set forth in claim 1, wherein the stabilizer is included with the mole number of two to eight times greater than the total mole number of the first compound and the second compound.

3. The composition as set forth in claim 2, wherein the stabilizer is at least one selected from the group consisting of monoethanolamine, diethanolamine, triethanolamine, mono-isopropyl amine, N,N-methyl ethanol amine, aminoethyl ethanolamine, diethylene glycol amine, ethylenediamine, tetra-methyl-ethyl-diamine, 2-(aminoethoxy) ethanol, N-t-butylethanolamine, N-t-butyl diethanolamine, tetramethyl-ammonium hydroxide, methyl amine, ethyl amine, and acetylacetone.

4. The composition as set forth in claim 3, wherein an atom number ratio of zinc to indium and tin is 1:9 to 9:1.

5. The composition as set forth in claim 3, wherein an atom number ratio of zinc to gallium, hafnium, magnesium, aluminum, yttrium, tantalum, titanium, zirconium, barium, lanthanum, manganese, tungsten, molybdenum, cerium, chromium, scandium, silicon, neodymium or strontium is 1:0.01 to 1:1.

6. The composition as set forth in claim 3, wherein concentrations of the first compound and the second compounds are each 0.1M to 10M.

7. A method of forming an oxide thin film, comprising:
coating a composition for an oxide thin film on a substrate; and
annealing the substrate with the coated composition at a temperature ranging from 100 to 450° C.,
wherein the composition for an oxide thin film comprises:
a first compound supplying zinc;
a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and
a stabilizer for adjusting conductivity,
wherein the stabilizer is included with the mole number of two to twelve times greater than the total mole number of the first compound and the second compound, and
wherein the stabilizer is at least one selected from the group consisting of monoethanolamine, diethanolamine, triethanolamine, mono-isopropyl amine, N,N-methyl ethanol amine, aminoethyl ethanolamine, diethylene glycol amine, ethylenediamine, tetra-methyl-ethyl-diamine, 2-(aminoethoxy) ethanol, N-t-butylethanolamine, N-t-butyl diethanolamine, tetramethylammonium hydroxide, methyl amine, ethyl amine, and acetylacetone.

8. The method as set forth in claim 7, wherein the annealing is conducted at a temperature ranging from 200 to 350° C.

9. The method as set forth in claim 8, wherein coating the composition for an oxide thin film on a substrate comprises coating the composition for an oxide thin film on a flexible substrate.

10. The method as set forth in claim 8, wherein coating the composition for an oxide thin film on a substrate comprises coating the composition for an oxide thin film on a glass substrate.

11. The method as set forth in claim 8, wherein the composition for an oxide thin film is coated on the substrate by means of spin coating, dip coating, inkjet printing, screen printing, spray printing or roll-to-roll coating.

12. The method as set forth in claim 8, wherein the annealing is conducted using a furnace, a hot plate or a rapid thermal processor.

13. An electronic device comprising:
an oxide semiconductor thin film formed by coating a composition for an oxide thin film on a substrate and annealing the substrate with the coated composition at a temperature ranging from 200 to 350 degrees centigrade;
a gate electrode spaced apart from the oxide semiconductor thin film and overlapping the oxide semiconductor thin film;
a source electrode electrically connected to the oxide semiconductor thin film and disposed at one end of the gate electrode; and
a drain electrode electrically connected to the oxide semiconductor thin film and disposed at the other end of the gate electrode to face the source electrode ° C.,
wherein the composition for an oxide thin film comprises:
a first compound supplying zinc;
a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and
a stabilizer for adjusting conductivity,
wherein the stabilizer is included with the mole number of two to twelve times greater than the total mole number of the first compound and the second compound, and
wherein the stabilizer is at least one selected from the group consisting of monoethanolamine, diethanolamine, triethanolamine, mono-isopropyl amine, N,N-methyl ethanol amine, aminoethyl ethanolamine, diethylene glycol amine, ethylenediamine, tetra-methyl-ethyl-diamine, 2-(aminoethoxy) ethanol, N-t-butylethanolamine, N-t-butyl diethanolamine, tetramethylammonium hydroxide, methyl amine, ethyl amine, and acetylacetone.

14. A semiconductor device comprising:
an oxide semiconductor thin film disposed on a flexible substrate or a glass substrate,
wherein the oxide semiconductor thin film is formed by coating a composition for an oxide thin film on the flexible or glass substrate and annealing the flexible substrate or the glass substrate with the coated composition at a temperature ranging from 200 to 350 degrees centigrade ° C., and
wherein the composition for an oxide thin film comprises:
a first compound supplying zinc;
a second compound supplying at least one selected from the group consisting of indium, tin, gallium, hafnium, magnesium, aluminum, yttrium, tantalum, titanium, zirconium, barium, lanthanum, manganese, tungsten, molybdenum, cerium, chromium, scandium, silicon, neodymium, and strontium; and
a stabilizer for adjusting conductivity,
wherein the stabilizer is included with the mole number of two to twelve times greater than the total mole number of the first compound and the second compound, and
wherein the stabilizer is at least one selected from the group consisting of monoethanolamine, diethanolamine, triethanolamine, mono-isopropyl amine, N,N-methyl ethanol amine, aminoethyl ethanolamine, diethylene glycol amine, ethylenediamine, tetra-methyl-ethyl-diamine, 2-(aminoethoxy) ethanol, N-t-butylethanolamine, N-t-butyl diethanolamine, tetramethylammonium hydroxide, methyl amine, ethyl amine, and acetylacetone.

* * * * *